United States Patent [19]

Weiner et al.

[11] Patent Number: 4,612,455
[45] Date of Patent: Sep. 16, 1986

[54] DISTRIBUTED PULSE FORMING NETWORK FOR MAGNETIC MODULATOR

[75] Inventors: Maurice Weiner, Ocean; John L. Carter, Belmar; Robert J. Youmans, Point Pleasant, all of N.J.

[73] Assignee: The United States of America as represented by the Secretary of the Army, Washington, D.C.

[21] Appl. No.: 608,840

[22] Filed: May 10, 1984

[51] Int. Cl.⁴ .............................................. H03K 3/00
[52] U.S. Cl. .................................... 307/419; 307/106; 323/329
[58] Field of Search ....................... 307/106, 419, 401; 323/329, 330, 339; 332/12

[56] References Cited

U.S. PATENT DOCUMENTS 2,897,294 7/1959 Lipkin .................................. 330/8 X

FOREIGN PATENT DOCUMENTS 455461 4/1975 U.S.S.R. ............................... 307/419

*Primary Examiner*—William M. Shoop, Jr.
*Assistant Examiner*—Alfred Hoyte
*Attorney, Agent, or Firm*—Anthony T. Lane; Jeremiah G. Murray; Edward Goldberg

[57] ABSTRACT

A pulse forming network with distributed inductance and capacitance is disclosed for use in a magnetic modulator. The magnetic modulator has a magnetic core with a primary winding and a secondary winding around it. The pulse forming network includes an inner winding of flattened wire around the magnetic core and connected to one end of the secondary winding for receiving an induced voltage. The pulse forming network also includes a metal foil shield around the inner winding, so that the induced voltage may be stored capacitively between the inner winding and the shield. When the magnetic core saturates, the impedance of the secondary winding drops, so that the pulse forming network discharges through a load. The shape of the pulse through the load is determined by the inductance of the inner winding and the capacitance between the inner winding and the shield. The number of turns per unit length of the inner winding, the spacing between the inner winding and the shield, and the dielectric constant of an insulating layer of material between the inner winding and the shield may all be modified to obtain a pulse forming network forming a desired pulse shape.

13 Claims, 5 Drawing Figures

DISTRIBUTED PULSE FORMING NETWORK FOR MAGNETIC MODULATOR

The invention described herein may be manufactured, used and licensed by or for the Government for Governmental purposes without the payment to me of any royalties thereon.

BACKGROUND OF THE INVENTION

1. Field of the Invention

The invention relates to a magnetic modulator circuit for providing a pulse to a load.

2. Description of the Prior Art

It has long been known that some magnetic materials have a characteristic saturation point at which their magnetic permeability changes rapidly as the applied magnetic field increases. Magnetic modulators or switches have been developed to make use of this characteristic. Typically, these magnetic modulators include a closed magnetic circuit or magnetic core, sometimes called a saturable reactor. A field is applied to the magnetic core by a primary coil, inducing a voltage across a secondary coil around the magnetic core. The secondary coil is connected to a pulse forming network which is essentially capacitive. As a result, when the magnetic core saturates, so that the impedance across the secondary coil drops, the pulse forming network discharges through the load.

An important advantage of magnetic modulators or switches is reliability. Since the switching action is provided by the magnetic core itself, no high voltage switch such as a spark gap or a thyratron is necessary. These high voltage switches wear out or erode over a period of usage, but the magnetic core does not wear out. It may become magnetized, but this condition can be reversed by an appropriate resetting coil.

As noted above, the typical magnetic modulator includes a pulse forming network which compresses the voltage induced in the secondary coil to provide a pulse to a load. The known pulse forming networks are separate components from the magnetic core. Typically, a pulse forming network includes one or more lumped components, such as capacitors. It is sometimes necessary to improve the flatness of the pulse top and to shorten the rise time for short pulses. This can be done by using a distributed pulse forming line such as a length of coaxial cable.

It would be advantageous to provide a distributed pulse forming network for a magnetic modulator or switching circuit which flattens the pulse top and shortens the rise time, but which does not require any additional components. Such an arrangement would reduce the size of the magnetic modulator, would improve the pulse shape, and would also provide the long life characteristic of magnetic modulators. It would further be desirable to provide a magnetic modulator with a distributed pulse forming network having an impedance which could be varied easily by modifying its parameters. In particular, a distributed pulse forming network having a high impedance is sometimes desirable, and is difficult to obtain using coaxial cable.

SUMMARY OF THE INVENTION

The pulse forming network of the invention realizes these and other advantages by providing a distributed pulse forming network on the magnetic core of a magnetic modulator. The resulting magnetic modulator component may be used to provide high quality pulses in a magnetic modulator circuit having no additional pulse forming network.

The magnetic modulator component in which the pulse forming network of the invention is used includes a magnetic core having a primary inductor on it for inducing magnetic flux in the core. A secondary inductor on the magnetic core is energized in response to the magnetic flux in the core. An inner element of the pulse forming network is on the core, connected for receiving energy from the secondary inductor. Around the inner element is an outer element, separated from the inner element by an insulating layer, so that the energy received by the inner element may be stored capacitively by the inner and outer elements.

The primary and secondary inductors may be windings around the magnetic core. The inner element may thus be an additional winding connected to the secondary winding, so that it will also have inductive characteristics. As a result, the pulse forming network is distributed, with both capacitance and inductance. If the magnetic core has a toroidal shape, the outer element may be a toroidal section around this additional winding and separated from it by an insulating layer.

The magnetic modulator circuit of the invention includes the magnetic modulator component of the invention. In addition, an input circuit is connected across the primary winding for providing power to induce magnetic flux in the core. The input circuit may include a capacitor for storing energy and a switch for releasing the energy stored in the capacitor into the primary winding. An output circuit is connected across the secondary winding and the inner and outer elements for providing a pulse of the capacitively stored energy from the magnetic modulator component to a load.

In addition, the capacitance of the inner and outer elements may be selected such that full charging occurs before the core saturates. To obtain different pulse shapes, the inductance of the inner element may be adjusted by changing the number of turns in the additional winding. Similarly, the capacitance of the inner and outer elements may be adjusted by changing the distance between them or by using an insulator having a different dielectric constant. The inner element may be flattened wire for enhancing capacitance.

Other objects, features and advantages of the invention will be apparent from the following description, together with the accompanying drawings and the appended claims.

DETAILED DESCRIPTION OF THE PREFERRED EMBODIMENTS

I. General Description

Figure 1:
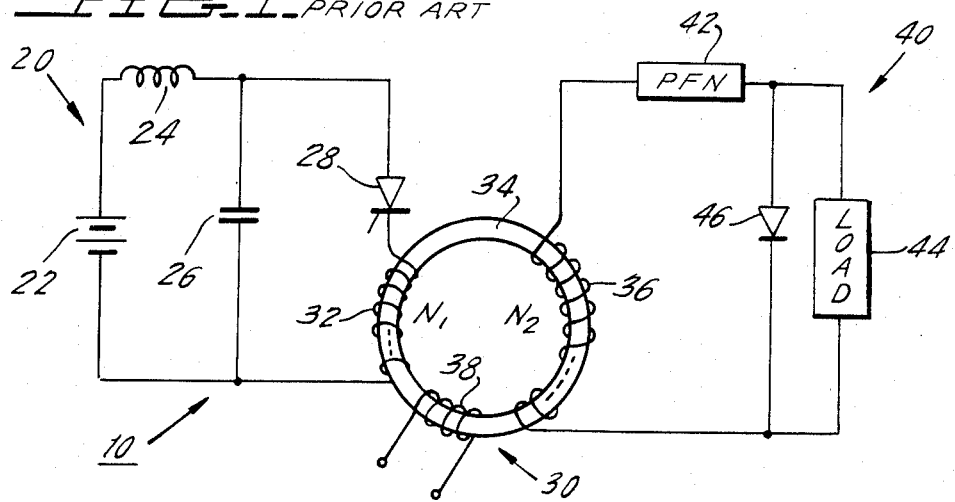
FIG. 1 is a schematic diagram showing a conventional magnetic modulator circuit.
Figure 2:
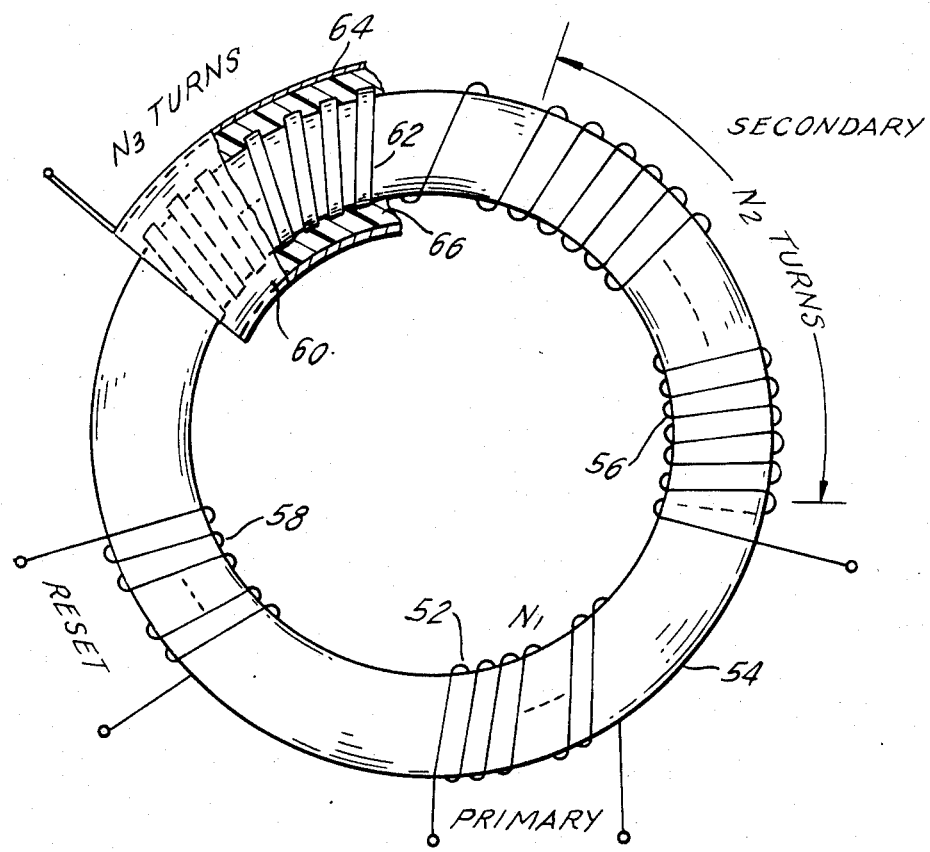
FIG. 2 is a schematic diagram showing the distributed pulse forming network of the invention in a magnetic modulator component.
Figure 4:
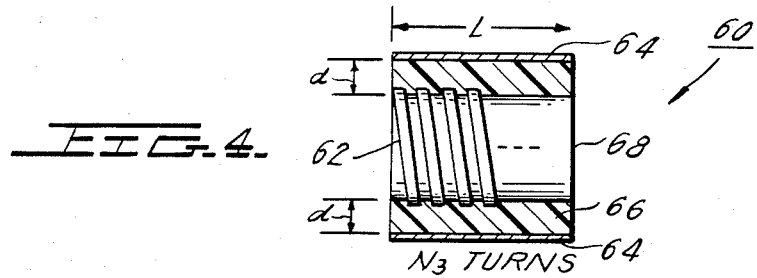
FIG. 4 is a schematic diagram showing in detail the distributed pulse forming network of FIG. 2.

The basic features of the invention can be understood by comparing the conventional single stage magnetic modulator circuit 10, shown in FIG. 1, with the magnetic modulator component and circuit shown in FIGS. 2 and 4.

As shown in FIG. 1, the conventional magnetic modulator 10 includes an input circuit 20, a step-up transformer 30, and an output circuit 40. The illustrative input circuit includes an energy source 22 connected across inductor 24 and capacitor 26. Energy source 22 will thus charge capacitor 26 until it reaches a predetermined voltage. Then a switch such as SCR 28 is triggered to permit capacitor 26 to discharge through primary winding 32 of the step-up transformer 30.

When primary winding 32 is activated by the energy discharged from capacitor 26, it induces a corresponding magnetic flux in magnetic core 34. Magnetic core 34 defines a magnetic circuit which also passes through secondary winding 36 and induces a current through winding 36 as well as a corresponding voltage between the ends of winding 36. Since secondary winding 36 has $N_2$ turns or loops around magnetic core 34, while primary winding 32 has $N_1$ turns, the voltage induced across secondary winding 36 bears the same proportion to the voltage across primary winding 32 as the ratio $N_2/N_1$. Since $N_2$ is typically greater than $N_1$, the result is a stepped-up voltage.

The stepped-up voltage is applied across pulse forming network (PFN) 42 which typically behaves like a capacitor. Therefore, PFN 42 becomes charged to the stepped-up voltage across secondary winding 36. Typically, the capacitance of PFN 42 and the saturation point of magnetic core 34 are selected such that PFN 42 is fully charged before magnetic core 34 saturates. Under ideal conditions, PFN 42 is also constructed so that the pulse which it generates has a pulse width bearing the same ratio to the charging time of PFN 42 as the turns in the primary winding 32 bear to the turns in the secondary winding 36, $N_1/N_2$. Therefore, the resulting pulse is compressed in time by the same factor by which the voltage is expanded.

As noted above, PFN 42 is ordinarily fully charged before magnetic core 34 saturates. When magnetic core 34 reaches saturation due to the magnetic field applied by primary winding 32, its permeability rapidly changes, causing the magnetic flux in the magnetic core 34 to stabilize. As a result, the impedance of secondary winding 36 rapidly switches to a relatively low value, permitting PFN 42 to discharge through secondary winding 36 and load 44. Load 44 may be a tube or other component in a microwave or mm-band wave system, or may be a laser. Output circuit 40 typically includes a shunt diode 46 to prevent current through load 44 while PFN 42 is being charged, but connected so that all of the current resulting from the discharge will flow through load 44. In addition, reset winding 38 around magnetic core 34 permits demagnetization.

FIG. 2 shows the magnetic modulator component 50 of the invention, which performs the functions of both the step-up transformer 30 and the PFN 42, described above. Like step-up transformer 30, magnetic modulator component 50 includes primary winding 52, magnetic core 54, secondary winding 56, and reset winding 58. In addition, however, component 50 includes pulse-forming network 60 on magnetic core 54, connected to secondary winding 56 for receiving and storing the energy induced in secondary winding 56. In addition, pulse forming network (PFN) 60 provides the stored energy as a pulse.

Figure 3:
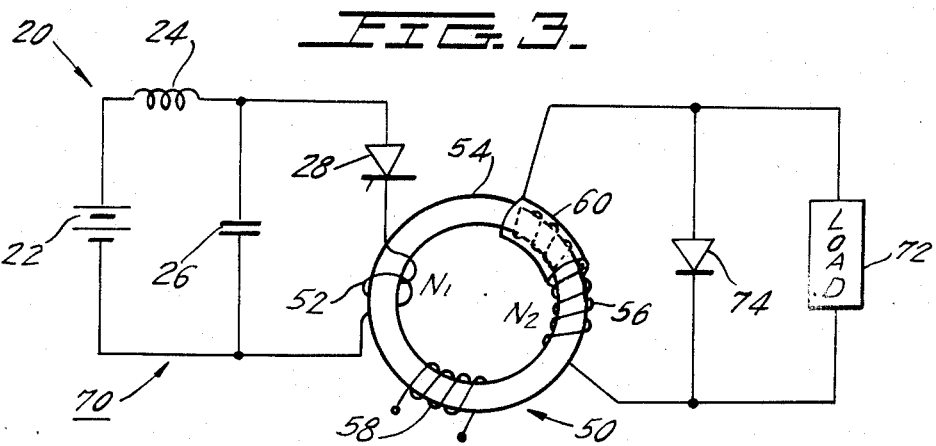
FIG. 3 is a schematic diagram showing a magnetic modulator circuit of the invention, including the magnetic modulator component of FIG. 2.

FIG. 3 shows an embodiment of the magnetic modulator circuit 70 of the invention, which includes magnetic modulator component 50, described above. In addition, magnetic modulator circuit 70 may include the same input circuit 20 or any other appropriate input circuit, but will have a different output circuit, since the load 72 may be connected directly to PFN 60 in the magnetic modulator component 50. Shunt diode 74 may also be provided, as described above.

A comparison between the magnetic modulator circuit 50 of FIG. 3 and the conventional circuit 10 of FIG. 1 shows that circuit 50 has been simplified by eliminating a separate PFN 42. Since PFN 42 may include a length of coaxial cable, as described above, eliminating separate PFN 42 may substantially reduce the size of circuit 70, and will also eliminate other problems relating to the conventional PFN 42. In addition, as discussed in greater detail below, PFN 60 on magnetic core 54 may be constructed to have superior characteristics compared to the conventional pulse forming networks.

II. Pulse Forming Network

The PFN 60 of the invention is shown in greater detail in FIG. 4, which is a partial cutaway view.

As shown in FIG. 4, PFN 60 includes an inner element which is a winding 62 having $N_3$ turns. PFN 60 also includes an outer element which is a conductive shield 64 around winding 62. Winding 62 and shield 64 are separated by a distance d, and both extend across a length L. The space defined between winding 62 and shield 64 may contain a dielectric material 66, and winding 62 is supported on a magnetic core 68 of a magnetic modulator. FIG. 4 shows core 68 with a generally cylindrical shape. In the embodiment shown in FIG. 2, however, winding 62 is supported on toroidal magnetic core 54, so that it is around a section of a toroid rather than a cylinder.

An important feature of PFN 60, as shown in FIG. 4, is that it is a distributed network. In other words, the inductance resulting from the turns or loops of winding 62 is not lumped in a location separate from the capacitance between winding 62 and shield 64. On the contrary, the inductance of winding 62 interacts with the capacitance of winding 62 and shield 64, resulting in excellent pulse formation, while occupying minimal space. As discussed in greater detail below, the distributed PFN 60 generates a pulse with improved pulse top flatness and faster rise time, in comparison with non-distributed PFNs. Furthermore, the use of winding 62 as the inner element results in much greater inductance per unit length than can be attained with coaxial cable. A coaxial cable will require a large ratio between outer conductor diameter and inner conductor diameter, as well as a greater length to obtain similar inductance.

FIG. 4 also illustrates various ways in which the impedance of PFN 60 may be varied by changing the inductance and capacitance. The capacitance of PFN 60 may be changed by increasing or decreasing distance d between winding 62 and shield 64. Alternatively, the capacitance may be modified by selecting an insulating material 66 having a desired dielectric constant. Similarly, the inductance of winding 62 may be modified by changing the pattern of the turns. Specifically, the number of turns per unit of length L may be increased or decreased to change the inductance per unit length. By these adjustments, it is possible to obtain high impedances, which are very difficult to obtain with coaxial cables.

In the embodiment shown in FIG. 4, winding 62 is made of a flattened wire in order to enhance the capacitance of PFN 60. In addition, conductive shield 64 may be made of a metal foil.

The PFN 60 as shwon in FIG. 4 may be incorporated in magnetic modulator component 50, shown in FIG. 2. We turn now to the specific characteristics of the magnetic modulator component 50.

III. Magnetic Modulator

As shown in FIG. 2, winding 62 of PFN 60 may be connected directly to secondary winding 56 to incorporate PFN 60 into magnetic modulator component 50. In addition, an extremely compact arrangement is possible if winding 62 is supported directly on magnetic core 54, as shown.

Magnetic core 54 may be constructed of any suitable magnetically permeable material which is saturable. For example, an Orthonal core or a core constructed of Metglas would be suitable. In general, to obtain a high-speed capability, a ferrite core or a very thin metal core no thicker than 0.5 mil is required.

Although magnetic core 54 carries flux through winding 62, the $N_3$ turns of winding 62 do not generally result in any further step-up in voltage, because conductive shield 64 acts as a shorted turn around winding 62. In addition, as can be seen in FIG. 2, conductive shield 64 may take the shape of a hollow toroidal section fully enclosing winding 62 in the radial direction from the axis of magnetic core 54.

In operation, magnetic modulator component 50 operates in a manner similar to step-up transformer 30, described above. When primary winding 52 is activated, magnetic flux induced in magnetic core 54 in turn induces a voltage across secondary winding 56. One end of winding 62 is connected to secondary winding 56, so that this voltage begins to charge the capacitor formed by winding 62 and conductive shield 64. The other end of winding 62 may remain unterminated. When magnetic core 54 becomes saturated, so that secondary winding 56 has a very low impedance, PFN 60 discharges, forming a pulse whose shape is determined by the interaction between the capacitance between winding 62 and shield 64 and the inductance of winding 62.

Figure 5:
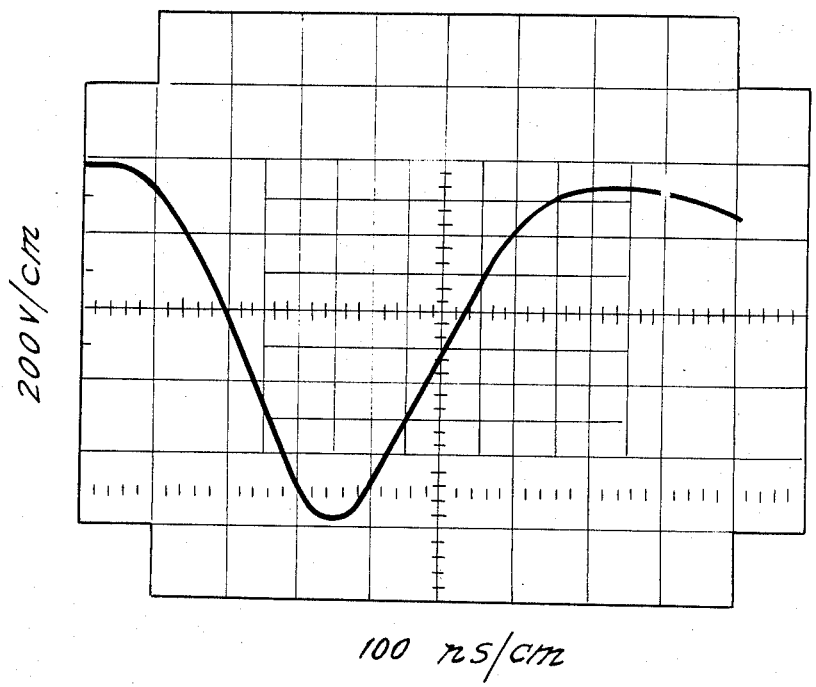
FIG. 5 is a graph showing a pulse waveform output from a magnetic modulator component like that shown in FIG. 2.

A specific pulse formed by the magnetic modulator circuit 50 of the invention is shown in FIG. 5. In this example, magnetic core 54 was constructed from an Orthonol core with an outer diameter of 3.0 inches, an inner diameter of 2.5 inches and a radial width of 0.5 inches. The windings were proportioned with $N_1=5$, $N_2=100$ and $N_3=10$. Inner winding 62 of PFN 60 was constructed of flattened wire to enhance capacitive coupling with conductive shield 64, constructed of metal foil. The total capacitance was approximately 200 pF and a resistive load of 5,000 ohms was driven in a circuit like that of FIG. 3. The input voltage to the primary winding 52 was 100 volts, and the amplitude of the pulse shown in FIG. 5 is approximately 1,000 volts, demonstrating that the PFN 60 of the invention effectively generates a pulse with excellent characteristics.

In view of the results shown in FIG. 5, it would be straightforward to adjust the parameters of the PFN 60 to obtain a desired pulse. For example, to improve the rise time of the pulse, as noted above, it would be preferable to use a ferrite core or a very thin metal core, such as Metglas, having a thickness no greater than 0.5 mil. In the above example, the Orthonol laminate had a thickness of 1.0 mil. Furthermore, the number of turns could be adjusted to obtain a desired voltage ratio.

Although the invention has been disclosed in relation to a single stage magnetic modulator circuit, it would be a straightforward matter to connect several magnetic modulator stages together to form a magnetic modulator circuit. In this case, each magnetic modulator stage would include a magnetic modulator component having the pulse forming network of the invention. Similarly, the invention has been disclosed in terms of a toroidal closed magnetic core, but other geometries could be used.

Although the present invention has been described in connection with a plurality of preferred embodiments thereof, many other variations and modifications will now become apparent to those skilled in the art. It is preferred, therefore, that the present invention be limited not by the specific disclosure herein, but only by the appended claims.

What is claimed is:

1. A magnetic modulator for forming pulses, comprising:
    a magnetic core for conducting magnetic flux;
    a primary inductor on the magnetic core for inducing a magnetic flux in the magnetic core;
    a secondary inductor on the core for receiving induced energy in response to the magnetic flux induced by the primary inductor; and
    a pulse forming network including a tertiary inductor and a capacitive element on the magnetic core, said tertiary inductor being connected to one end of said secondary inductor, said network receiving and storing the induced energy from the secondary inductor and providing the stored energy as a pulse.

2. The device of claim 1 in which the primary inductor is an input coil winding around the core, the secondary inductor is an output coil winding around the core, the tertiary inductor is an inner coil winding on the magnetic core, and the capacitive element includes an outer conductive shield around and spaced apart from the inner coil and a dielectric material between said inner coil and outer shield, the inner coil being connected for receiving the induced energy from the secondary output coil.

3. The device of claim 2 in which the conductive shield comprises metal foil.

4. The device of claim 3 in which the inner winding comprises flattened wire for enhancing capacitive coupling with the conductive shield.

5. The component of claim 2 in which, the inner winding and conductive shield a space between them, the width of the space determining the capacitance of the pulse forming network.

6. The device of claim 5 in which the magnetic core is a toroid wherein the inner winding includes a plurality of turns arranged with a predetermined density along the length of the toroid.

7. The device of claim 6 in which the conductive shield is a hollow toroidal section completely surrounding a corresponding section of said toroid.

8. The device of claim 2 including an input circuit connected for activating the primary inductor; and an output circuit connected for receiving the pulse from the pulse forming network.

9. The device of claim 8 in which the output circuit comprises a load, the load being connected directly to the pulse forming network.

10. The device of claim 9 in which the magnetic core is saturable, said secondary winding having a low impedance upon activation of said primary winding and saturation of said magnetic core to cause discharge of said pulse forming network through said load and provide a pulse shape determined by the capacitance and inductance of said network.

11. The device of claim 10 in which the spacing between the inner coil winding and the shield, the dielectric constant of material therein and the number of turns of said inner coil determine said pulse shape.

12. The device of claim 10 including a reset coil on said core.

13. The magnetic device of claim 9 wherein the load is connected to the conductive shield for receiving the pulse.

* * * * *